Nov. 22, 1966 W. MINNER 3,287,671
TUNABLE TANK CIRCUIT CONTAINING PLURAL INNER CONDUCTORS
BENDABLE RELATIVE TO ONE ANOTHER
Filed Oct. 15, 1964

INVENTOR
Willy Minner

BY Spencer & Kaye
ATTORNEYS

United States Patent Office 3,287,671
Patented Nov. 22, 1966

3,287,671

TUNABLE TANK CIRCUIT CONTAINING PLURAL INNER CONDUCTORS BENDABLE RELATIVE TO ONE ANOTHER

Willy Minner, Ingolstadt, Germany, assignor to Telefunken Patentverwertungs-G.m.b.H., Ulm (Danube), Germany Filed Oct. 15, 1964, Ser. No. 404,112
Claims priority, application Germany, Oct. 17, 1963, T 24,905
9 Claims. (Cl. 333—82)

Figure 2:
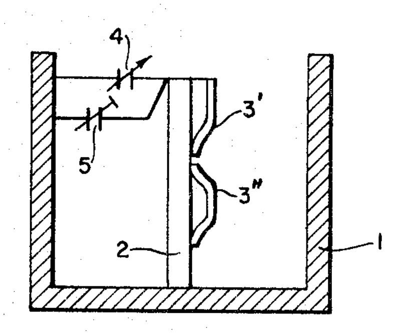

The present invention relates to a tunable tank circuit which is provided with an inner conductor.

Tunable tank circuits constituted by an outer wall or conductor and an inner conductor are used for many different purposes as, for example, in apparatus in which a UHF (ultra-high frequency) signal, for example 400 to 1,000 megacycles, is to be amplified and is then transposed to an intermediate frequency. Such tank circuits are generally continuously tunable to a certain receiver frequency which itself lies within a given frequency band, in which case the tank circuit acts as, and is conventionally known as, a UHF tuner. These tuners are used, in conjunction with certain so-called active elements, for selecting the desired receiving frequency and for producing the necessary oscillator frequency, and find practical application in, for example, television receivers.

For the resonant tuning of the tank circuit, reference is had primarily to the half wavelength or the quarter wavelength. In order to enable the tuner to be tuned to the desired resonant frequency, rotary capacitors are used which, in effect, shorten the tank circuit so as to obtain the desired frequency. However, inasmuch as at least two, and generally three or more circuits have to be used for purposes of selective reception and for transposing to the intermediate frequency, all of them to be coordinated with each other over the entire frequency band. In order to allow such a tuner to be made by practical mass production techniques, it is to advantage if a basic alignment can be effected for, for example, the highest and lowest frequencies to which the tuner is to be tuned, i.e., if the resonant circuit can be tuned for these two receiving frequencies in such a manner that the alignment at each of these two frequencies will have substantially no effect on the alignment of the tuner at the other of the two frequencies. This type of alignment is commonly referred to, in the radio engineering field, as the fundamental two-point aligning.

This two-point aligning is possible, and, indeed, known for half wavelength tank circuits, inasmuch as the voltage and current distribtuion along the inner conductor will, for example, for the highest frequency to be received, be such that a voltage node is formed on the inner conductor at a point which is spaced one quarter of a wavelength from the rotary capacitor. Thus, a trimmer can be connected to the inner conductor at this point which itself does not affect the aligning for the highest frequency, but which does, however, affect the tuning for the lower frequencies. The two-point aligning will then be carried out as follows: first, the rotary capacitor is turned completely in, whereupon the trimmer is used to tune the tank circuit so as to be resonant at the lowest frequencies. The rotary capacitor is then turned completely out, whereupon the tuner is aligned, that is to say, adjusted, to be resonant at the highest frequency, by means of a second trimmer which is connected in parallel with the rotary capacitor. The fine aligning over the entire frequency band is then carried out by adjusting the individual plates of the rotary capacitor.

In the case of quarter wavelength tuners, however, the voltage and current distribution along the inner conductor is such that the voltage node will be at the juncture of the inner conductor and the outer conductor, i.e., the bottom of the outer conductor, at all received frequencies. Consequently, the present state of the art is such that the two-point aligning of a quarter wavelength conductor is carried out by mechanically changing the length of the inner conductor. This, it will be appreciated, is a relatively complicated procedure, involving elaborate mechanical equipment, which, in turn, makes the two-point alignment of a quarter wavelength tuner an expensive proposition and has, in practice, been found to be somewhat of a bottleneck insofar as mass production is concerned.

It is, therefore, the primary object of the present invention to overcome the above drawbacks and, with this object in view, this is accomplished by providing a tuner whose inner conductor consists of at least two parallelly connected conductors. As a result, the inductance of the inner conductor may, in a very simple manner, be varied within certain limits by mechanically, i.e., physically, varying the spacing between the two inner conductors. This, then, allows even a quarter wavelength tank circuit to be aligned by the above-discussed two-point method, in that, for a low frequency of the receiving band throughout which the tuner is to be tuned, the necessary inductance is adjusted by changing the coupling of the two inner conductors, and for a high frequency, the starting capacitance of the tuning capacitor is varied by means of a trimmer which is connected in parallel with this tuning capacitor.

Figure 1:
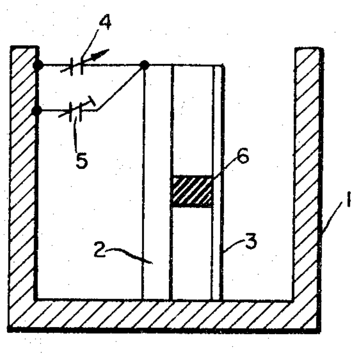
Figure 3:
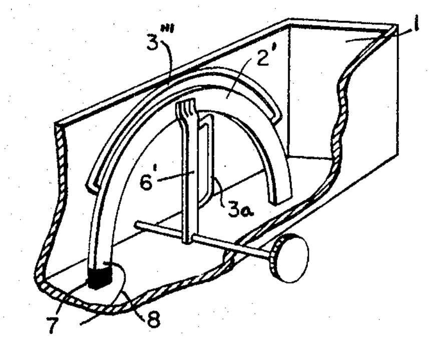

Additional objects and advantages of the present invention will become apparent upon consideration of the following description when taken in conjunction with the accompanying drawing in which FIGURE 1 is a sectional view of one embodiment of a quarter wavelength tank circuit incorporating an inner conductor in accordance with the present invention, FIGURE 2 is a sectional view of another embodiment of a quarter wavelength tank circuit incorporating an inner conductor in accordance with the present invention, and FIGURE 3 is a perspective view of yet another embodiment of a quarter wavelength tank circuit incorporating an inner conductor in accordance with the present invention.

Referring now to FIGURE 1, the same shows a tank circuit whose outer conductor 1 is made of metal or a metallized plastic, the inner conductor being constituted by two conductor elements 2 and 3 which are connected in parallel. The lower end of each of the conductors 2, 3, as viewed in the figure, constitutes the grounded end, while the other end of each of the two inner conductors is the so-called "hot" end. The tuner can be tuned to the desired resonant frequency by means of a rotary capacitor 4, which is connected to the "hot" end of each of the inner conductors 2, 3. The starting capacitance of the tuner is set by means of a trimmer capacitor 5 which is connected in parallel with the rotary capacitor 4.

The inner conductor elements 2, 3, will, due to their spatial arrangement, be electromagnetically coupled to each other. Since the current will flow through the two conductor elements 2, 3, in the same direction, the inductance of the inner conductor as a whole is increased when the conductor element 2 is moved closer to the conductor element 3, and will be decreased as the distance between the conductor elements 2, 3, increases. It will be understood that changing the spacing between the two inner conductor elements 2, 3, will produce exactly the same result as if the inner conductor were mechanically lengthened or shortened. Since the spacing between the conductor elements 2 and 3 can be changed simply by bending one of the elements with respect to the other, a practical tuner according to the present invention will be so built that the inner conductor element 2 has a larger conductive cross section than the conductor element 3, in which case all that is necessary to change the inductance of the inner conductor, constituted by the elements 2, 3, is simply bending the conductor element 3 either toward or away from the conductor element 2.

It will be appreciated, then, that the above-described tuner can be aligned by the two-point method by changing the distance between the conductor elements 2 and 3, while the rotary capacitor 4 is turned in, i.e., occupies its position of maximum capacitance, to the desired lowest receiving frequency, whereafter the capacitor 4 is turned out, i.e., made to assume its condition of minimum capacitance, whereupon the trimmer capacitor 5 is used for tuning the tuner to the maximum receiving frequency. Fine tuning can then be effected in the usual manner, as explained above.

The tuner described above has the advantage that it can favorably influence the temperature effect of the frequency. In most cases, the resonant frequency of the tuner will change after the tuner has been warmed up. Thus, the temperature effect can be compensated for by means of a spacer 6, which is preferably wedge-shaped and which is interposed between the conductor elements 2, 3, and is fixedly connected thereto, for example by means of an adhesive. The temperature compensation effect will then be obtained if the material of which the spacer 6 is made has the requisite coefficient of thermal expansion. In practice, the material of which the spacer 6 is made will be an insulator.

If desired, only portions of the inner conductor need be constituted of a plurality of individual inner conductors. Such a structure is shown in FIGURE 2 wherein the inner conductor is constituted by a conductor element 2, which is identical with the similarly-numbered element of FIGURE 1, and two inner conductor elements 3′ and 3″ which extend along only a portion of conductor element 2. Elements 3′ and 3″ are mounted on element 2 in the manner shown with the upper end of element 3′ being conductively connected to the upper end of element 2. The inductance of the inner conductor assembly is controlled by varying the shape of, and the spacing between, the conductor elements 3′ and 3″.

Furthermore, the present invention can be used in conjunction with inductively tunable tank circuits. In that case, one or more conductors can be arranged and switched in in parallel, either by themselves or in parallel with the slide 6′ by means of which the electrical length of the inner conductor is shortened. Such an arrangement is shown in FIGURE 3 wherein the inner conductor is constituted by a semicircular conductor element 2′ and an arcuate conductor element 3‴ connected in parallel with the central portion of element 2′. One end of element 2′ is grounded to the outer conductor 1, while the other end thereof, which is the so-called "hot" end, is mounted on the outer conductor 1 through the intermediary of an insulating spacer 7. The end of element 2′ connected to the spacer 7 is provided with a conductor lead 8 for connection to an external circuit. Inner conductor element 2′ is contacted by a rotatable slide 6′ whose free end contacts the surface of element 2′. Slide 6′ is provided with a conductor element 3a connected in parallel with a major portion thereof. Elements 3‴ and 3a are each made similar to element 3 of FIGURE 1. As a result, these elements are capable of being bent so as to vary their spacing from the member on which they are mounted, thereby to vary the inductance of the assembly.

The following is an illustrative example of a tuner according to the present invention. The tank circuit is a quarter wavelength tuner for use in the 400 to 1,000 megacycle range, and the inner conductors 2, 3, will be 15–25 mm. long. The conductor 2 has a cross section of 2 mm. by 7 mm., and the conductor 3 is a strip of a silvered copper wire having a diameter of 0.8 mm. The conductors 2 and 3 are spaced on an average 1–3 mm. from each other in the region of their grounded ends, though the conductor 3 may be bent so that its upper or "hot" end is spaced anywhere from 1 mm. to 3 mm. from the "hot" end of conductor 2.

In order to obtain the above-mentioned temperature compensation, the spacer 6 is preferably made of a polycarbonate as for example known under the registered trademark "Makrolon."

It will be understood that the above description of the present invention is susceptible to various modifications, changes and adaptations, and the same are intended to be comprehended within the meaning and range of equivalents of the appended claims.

What is claimed is:

1. A tunable tank circuit comprising an outer conductor and an inner conductor comprising at least two substantially parallel spaced-apart individual conductor elements which are electrically connected together in parallel and which are movable relative to one another for varying the distance therebetween.

2. A tunable tank circuit comprising an outer conductor and an inner conductor having at least two spaced-apart individual conductor elements, with at least one of said conductor elements being susceptible to being bent toward or away from the other of said conductor elements for adjusting the distance therebetween, and said one conductor element has a smaller cross section than the other conductor element, thereby to allow said one conductor element to be bent more readily than said other element.

3. A tunable tank circuit comprising an outer conductor and an inner conductor having at least two spaced-apart individual conductor elements, with at least one of said conductor elements being susceptible to being bent toward or away from the other of said conductor elements for adjusting the distance therebetween, and further comprising a spacer inserted between said conductor elements for adjusting the distance therebetween.

4. A tank circuit as defined in claim 3 wherein said spacer is made of a material having a coefficient of expansion which results in temperature compensation as the result of warming up of said tuner at resonant frequency.

5. A tank circuit as defined in claim 3 wherein said spacer is made of insulating material.

6. A tank circuit as defined in claim 3 wherein said spacer is fixedly secured in position between said conductor elements.

7. A tunable tank circuit comprising an outer conductor, an inner conductor, and at least one further conductor element electrically connected with and fastened mechanically approximately parallel to said inner conductor element, with the distance between said at least one further conductor element and said inner conductor element being adjustable.

8. An inductively tunable tank circuit comprising an outer conductor, an inner conductor, a slide contacting said inner conductor for varying the electrical length of said inner conductor, and at least a first conductor element electrically connected in parallel with, and fastened mechanically approximately parallel to said inner conductor, the distance between said first conductor element and said inner conductor being adjustable.

9. An arrangement as defined in claim 8 further comprising at least a second conductor element electrically connected in parallel with, and fastened mechanically approximately parallel to, said slide, the distance between said second conductor element and said slide being adjustable.

References Cited by the Examiner

UNITED STATES PATENTS

| | | | |
|---|---|---|---|
| 2,731,604 | 1/1956 | Hubbard | 334—41 |
| 3,154,755 | 10/1964 | Wegener | 333—82 |

OTHER REFERENCES

Ghirardi, A. A.: Radio Physics Course, second edition, 1937 Radio and Technical Publishing Co., New York, pp. 553–555 relied on.

HERMAN KARL SAALBACH, *Primary Examiner.*

L. ALLAHUT, *Assistant Examiner.*